US006996900B2

(12) United States Patent
Hattori

(10) Patent No.: US 6,996,900 B2
(45) Date of Patent: Feb. 14, 2006

(54) PRODUCTION METHOD FOR MICRO-STRIP FILTER

(75) Inventor: Wataru Hattori, Tokyo (JP)

(73) Assignee: NEC Corporation, Tokyo (JP)

( * ) Notice: Subject to any disclaimer, the term of this patent is extended or adjusted under 35 U.S.C. 154(b) by 109 days.

(21) Appl. No.: 10/486,562

(22) PCT Filed: Aug. 26, 2002

(86) PCT No.: PCT/JP02/08575

§ 371 (c)(1),
(2), (4) Date: Feb. 11, 2004

(87) PCT Pub. No.: WO03/021712

PCT Pub. Date: Mar. 13, 2003

(65) Prior Publication Data

US 2004/0201432 A1 Oct. 14, 2004

(30) Foreign Application Priority Data

Aug. 28, 2001 (JP) ....................................... 2001-258502

(51) Int. Cl.
*H05K 3/10* (2006.01)

(52) U.S. Cl. ............................. 29/846; 29/600; 29/825; 333/204; 333/205; 333/235

(58) Field of Classification Search ................... 29/600, 29/825, 846; 333/204, 205, 235
See application file for complete search history.

(56) References Cited

U.S. PATENT DOCUMENTS 4,288,530 A * 9/1981 Bedard et al. .............. 430/315
4,638,271 A 1/1987 Jecko et al.
4,706,050 A * 11/1987 Andrews .................... 333/205
5,025,235 A 6/1991 Pramanick

FOREIGN PATENT DOCUMENTS

JP 4-280502 10/1992
JP 10-41557 2/1998

* cited by examiner

*Primary Examiner*—Carl J. Arbes
(74) *Attorney, Agent, or Firm*—Young & Thompson

(57) ABSTRACT

A production method for a band-pass micro-strip filter which need not conduct an adjusting process on the central frequency in a pass band based on the frequency characteristics of a filter that have been previously measured and inspected after the filter is produced. The production method for a micro-strip filter includes the step of adjusting, in the production process, a resonator length according to the thickness and capacitance of a substrate that have been measured in advance.

15 Claims, 6 Drawing Sheets

PRODUCTION METHOD FOR MICRO-STRIP FILTER

TECHNICAL FIELD

The present invention relates to a method for manufacturing a band-pass microstrip filter, and in particular, to a method for manufacturing a microstrip filter including a step for adjusting the length of resonators or the length of the resonance of an electromagnetic wave in microstrip resonators depending on the thickness or capacitance of the substrate of the microstrip filter.

BACKGROUND ART

A band-pass microstrip filter is generally made up by placing a plurality of microstrip resonators each resonating at the center frequency of a pass band at intervals corresponding to a coupling coefficient to thereby realize frequency characteristics satisfying design requirements. Therefore, when manufacturing the band-pass microstrip filter, the microstrip resonators have to be adjusted so as to resonate at the center frequency of the pass band even if the capacitance between the ground surface and the microstrip pattern has changed due to variations in the thickness of the substrate or the like. Such adjustment is carried out after the microstrip filter is manufactured and packaged using adjust screws made of metal or dielectric material while measuring the frequency characteristics of the filter. Alternatively, in especial when the center frequency of the resonators is low, it is necessary to perform an adjustment process for adjusting the center frequency to a design value by shortening the length of the resonators by trimming, etching, etc. after the measurement of the frequency characteristics. Although the latter adjustment process requires extremely complicated steps as compared with the former, the center frequency can be adjusted more precisely than if the adjust screws were employed. Besides, the latter adjustment process, free from variation or change over time caused by the loosening of screws etc. in principle, has the advantage of high reliability. For example, in narrow-band-pass high-temperature superconducting microstrip filters with a relative bandwidth of about 1% of 2 GHz, which are employed in mobile communications, when MgO substrates 0.5 mm thick are used, there generally are variations of ±8 $\mu$m or ±1.6% in thickness from substrate to substrate, and thereby the capacitance between strip patterns and ground surfaces also varies. Consequently, the resonance frequency of the resonators deviates from the design value, and the center frequency of the filter also deviates from the design value. Therefore, the processes for adjusting the deviated center frequency to the design value have been required. In other words, after producing the filter pattern, it has been necessary to package the filter, measure the frequency characteristics of the filter, return the filter to the manufacturing process depending on the measurement result, and shorten the length of the resonators by a proper length by means of trimming or etching.

PROBLEMS THAT THE INVENTION IS TO SOLVE

However, in the case of carrying out such adjustments, especially, when shortening the length of resonators of a filter by means of trimming or etching, the filter has to be packaged after once undergoing the manufacturing process in order to measure the frequency characteristics, taken out of the package after the measurement, and then returned to the manufacturing process. Thus, the process is extremely complicated. Moreover, since the process involves a large number of steps, the price of the product is increased.

It is therefore an object of the present invention to provide a method for manufacturing a microstrip filter, which is made up by arranging a plurality of microstrip resonators each resonating at the center frequency of a pass band at intervals corresponding to a coupling coefficient, wherein the number of manufacturing steps is reduced.

DISCLOSURE OF THE INVENTION

In accordance with the present invention, to achieve the above object, there is provided a method for manufacturing a microstrip filter, characterized in that a resonator length adjustment step for adjusting the resonator length of microstrip resonators without measuring and inspecting the frequency characteristics of the microstrip filter is included in a filter pattern processing step for processing a conductor layer formed on a dielectric substrate into a filter pattern of the microstrip filter.

In accordance with the microstrip filter manufacturing method of the present invention, in the first aspect, the filter pattern processing step includes: the step of defining a conductor pattern of a filter pattern formation area in the conductor on the dielectric substrate; the step of defining a filter pattern before resonator length adjustment in the conductor; and the resonator length adjustment step for forming the filter pattern before resonator length adjustment into a filter pattern with an adjusted resonator length using a mask pattern for shortening the resonator length.

In accordance with the microstrip filter manufacturing method of the present invention, in the second aspect, the filter pattern processing step includes: the step of defining a conductor pattern of a filter pattern formation area in the conductor on the dielectric substrate; the step of forming a resist coated on the conductor into a first resist pattern, a filter pattern before resonator length adjustment; the resonator length adjustment step for forming the first resist pattern into a second resist pattern, a filter pattern with an adjusted resonator length, using a mask pattern for shortening the resonator length; and the step of etching the conductor pattern using the second resist pattern as a mask.

In accordance with the microstrip filter manufacturing method of the present invention, in the third aspect, the filter pattern processing step includes: the step of forming one or more first register marks made of the conductor at predetermined positions on the dielectric substrate as well as etching the conductor on the dielectric substrate to produce a conductor pattern of a filter pattern formation area; the step of applying a resist on the dielectric substrate; the step of forming one or more second register marks made of the resist at predetermined positions on the dielectric substrate as well as exposing and developing the resist so as to produce a filter pattern before resonator length adjustment as a first resist pattern; the step of forming the conductor pattern into the filter pattern before resonator length adjustment using the first resist pattern as a mask; and the resonator length adjustment step for forming the filter pattern before resonator length adjustment into a filter pattern with an adjusted resonator length using a mask pattern for shortening the resonator length and one at least of the first and second register marks.

In accordance with the microstrip filter manufacturing method of the present invention, in the fourth aspect, the filter pattern processing step includes: the step of forming one or more first register marks made of the conductor at predetermined positions on the dielectric substrate as well as etching the conductor on the dielectric substrate to produce a conductor pattern of a filter pattern formation area; the step of applying a resist on the dielectric substrate; the step of forming one or more second register marks made of the resist at predetermined positions on the dielectric substrate as well as exposing and developing the resist so as to produce a filter pattern before resonator length adjustment as a first resist pattern; the resonator length adjustment step for forming the first resist pattern into a second resist pattern, a filter pattern with an adjusted resonator length, using a mask pattern for shortening the resonator length and one at least of the first and second register marks; and the step of etching the conductor pattern using the second resist pattern as a mask.

In accordance with the microstrip filter manufacturing method of the present invention, in the fifth aspect, the filter pattern processing step includes: the step of forming one or more register marks made of the conductor at predetermined positions on the dielectric substrate as well as etching the conductor on the dielectric substrate to produce a conductor pattern of a filter pattern formation area; the step of applying a resist on the dielectric substrate; the step of exposing the resist in the filter pattern formation area using a mask pattern in a filter pattern before resonator length adjustment; the resonator length adjustment step for exposing and developing the resist in the filter pattern formation area using a mask pattern for shortening the resonator length and the register mark(s); and the step of etching the conductor pattern using the developed resist as a mask so as to produce a filter pattern with an adjusted resonator length on the dielectric substrate.

In accordance with the microstrip filter manufacturing method of the present invention, in the sixth aspect, the filter pattern processing step includes: the step of producing a first resist pattern of a first resist on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the step of exposing and developing the first resist pattern on the conductor pattern so as to produce a second resist pattern using a mask pattern for shortening the resonator length and the register mark(s); the resonator length adjustment step for etching the conductor pattern using the second resist pattern as a mask; the step of applying a second resist on the conductor pattern with an adjusted resonator length after removing the first resist and exposing and developing the second resist so as to produce a third resist pattern using a mask in a filter pattern before resonator length adjustment; and the step of etching the conductor pattern using the third resist pattern as a mask so as to produce a filter pattern with an adjusted resonator length on the dielectric substrate.

In accordance with the microstrip filter manufacturing method of the present invention, in the seventh aspect, the filter pattern processing step includes: the step of producing a first resist pattern on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the resonator length adjustment step for exposing and developing the first resist pattern on the conductor pattern so as to produce a second resist pattern using a mask pattern for shortening the resonator length and the register mark(s); the step of exposing and developing the second resist pattern so as to produce a third resist pattern using a mask in a filter pattern before resonator length adjustment; and the step of etching the conductor pattern using the third resist pattern as a mask so as to produce a filter pattern with an adjusted resonator length on the dielectric substrate.

In accordance with the microstrip filter manufacturing method of the present invention, in the eighth aspect, the filter pattern processing step includes: the step of producing a first resist pattern on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the resonator length adjustment step for exposing the first resist pattern on the conductor pattern using a mask pattern for shortening the resonator length and the register mark(s); the step of exposing and developing the first resist pattern so as to produce a second resist pattern using a mask in a filter pattern before resonator length adjustment; and the step of etching the conductor pattern using the second resist pattern as a mask so as to produce a filter pattern with an adjusted resonator length on the dielectric substrate.

In accordance with the microstrip filter manufacturing method of the present invention, in the resonator length adjustment step, the mask pattern is positioned so as to be offset with respect to the conductor pattern by a length by which the length of the microstrip resonators is to be shortened, which is calculated based on the capacitance of the dielectric substrate measured in advance. The measurement of capacitance may be made between a ground conductor layer formed on one surface of the dielectric substrate and the conductor pattern produced in the filter pattern formation area on the other surface of the dielectric substrate. By making the measurement of capacitance, the uncertainty in the relationship between the capacitance and the center frequency, which arises when there are major errors or variations in the substrate area (size), the substrate edge thickness, etc. can be eliminated. In addition, the influence of variations in the dielectric constant etc. in the substrate can be reduced.

In the resonator length adjustment step, the mask pattern may be set so as to be offset with respect to the conductor pattern by a length by which the length of the microstrip resonators is to be shortened, which is calculated based on the thickness of the dielectric substrate measured in advance.

In accordance with the microstrip filter manufacturing method of the present invention, the filter pattern before resonator length adjustment is designed so that the center frequency of the microstrip resonators becomes a desired center frequency or less based on the range of estimated error between the desired thickness and actual thickness of the dielectric substrate.

In accordance with the microstrip filter manufacturing method of the present invention, superconductors may be employed as conductor material of the microstrip resonators. Besides, high-temperature superconductors may be utilized as the superconductors. With the use of superconductor material as the conductor material, the unloaded Q value of the resonators can be set to approximately 100,000, and thereby a multistage narrow-band-pass filter of ten or more stages can be build up.

In accordance with the microstrip filter manufacturing method of the present invention, a band-pass microstrip filter can be manufactured without having to conduct the step of adjusting the center frequency of a pass band based on the frequency characteristics of the filter, which have been measured and inspected in advance after producing the filter.

Figure 1:
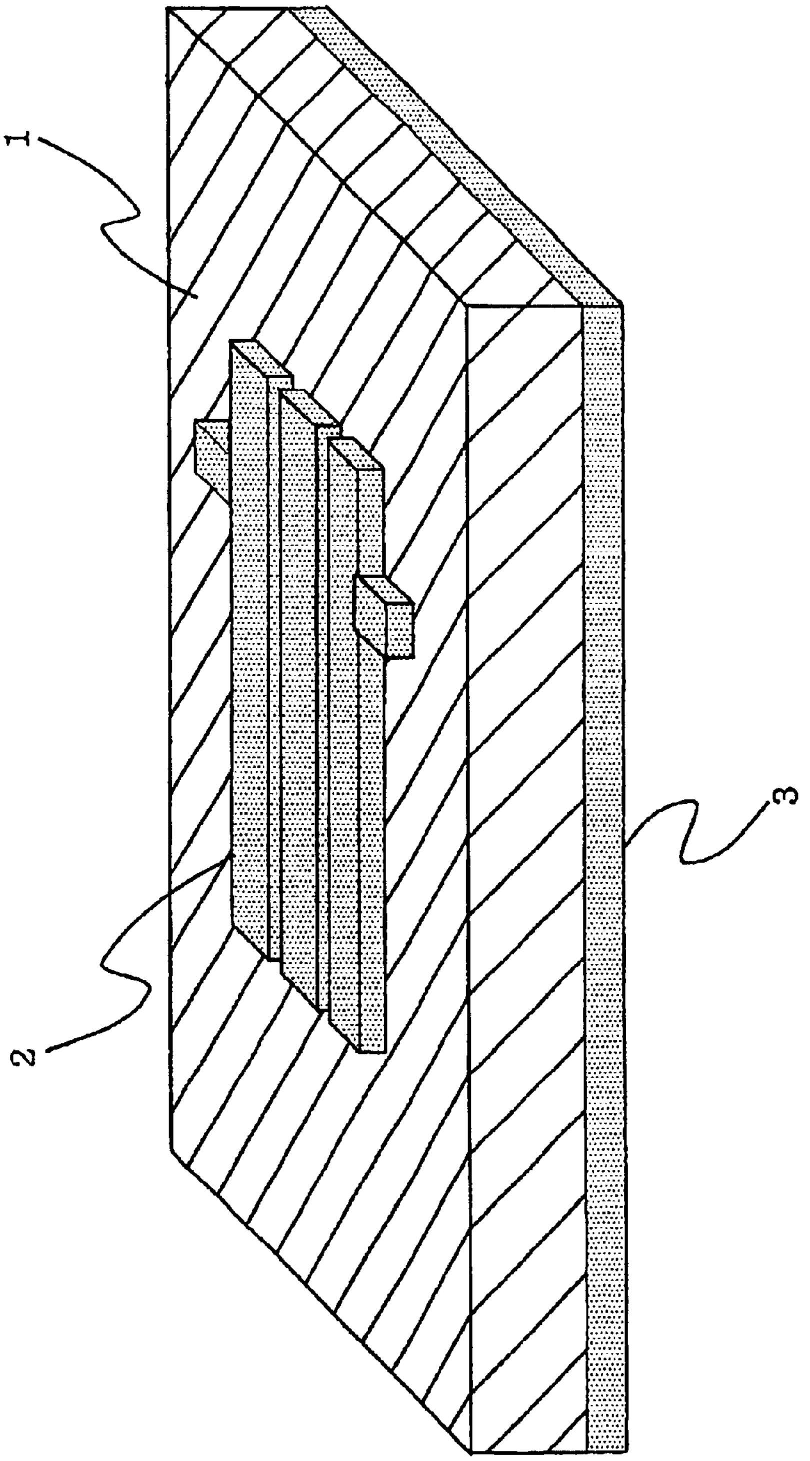
FIG. 1 is a perspective view showing an example of the configuration of a microstrip filter which is manufactured by a microstrip filter manufacturing method according to the present invention.

Incidentally, the reference numeral 1 represents a dielectric substrate. The reference numeral 2 represents a filter pattern. The reference numerals 2A and 3A represent conductor layers. The reference numeral 3 represents a conductor. The reference numeral 4 represents a resist pattern. The reference numeral 5 represents a mask pattern.

BEST MODE FOR CARRYING OUT THE INVENTION

Referring now to the drawings, a description will be given in detail of embodiments of a microstrip filter manufacturing method in accordance with the present invention. The embodiments of the microstrip filter manufacturing method of the present invention are schematically illustrated in FIGS. 1 to 6.

First, a description will be made of an example of the configuration of a microstrip filter which is manufactured by a microstrip filter manufacturing method according to the present invention with reference to FIG. 1. In FIG. 1, a filter pattern 2 is produced on the top surface of a dielectric substrate 1. On the underside of the dielectric substrate 1, a conductor 3 as a ground surface is formed.

As the material for the dielectric substrate 1, for example, alumina ceramics and MgO monocrystal can be employed. Besides, substrate manufacturers usually carry out inspections to check whether or not thickness specifications are satisfied with respect to each substrate before shipment, therefore, it is unnecessary to measure the thickness of substrates if the inspection data can be obtained with the substrates from the manufacturer.

Conductor material for the filter pattern 2 and the conductor 3 that forms the ground surface should preferably be selected from superconductors or high-temperature superconductors. In the case of employing a high-temperature superconductor, a thin layer of metal material such as gold etc. having low reactivity with the high-temperature superconductor may be deposited thereon for surface protection or for electrodes. By employing the superconductors as the conductor material, the unloaded Q value of resonators can be set to approximately 100,000, and thereby a multistage narrow-band-pass filter of ten or more stages can be build up. As the high-temperature superconductors, for example, Bi-base, Tl-base, Hg-base, Y-base, Ag-base, etc. copper oxide superconductors can be used. These copper oxide superconductors undergo a transition to superconductive state at temperatures around 100K. Such superconductors can be brought into superconductive state only by cooling them to about 77K, the boiling point of liquid nitrogen under 1 atm, and therefore, the cooling power of the cooler can be saved. Consequently, a small-sized and low-priced cooler become available. Besides, a good conductor such as copper can be employed as the conductor material for the filter pattern 2 and the conductor 3 that forms the ground surface. In this case, a thin layer of titanium with a thickness of about 10 nm may be sandwiched in between the dielectric substrate and the good conductor to improve the adhesion of the good conductor to the dielectric substrate 1.

In the following, a method for manufacturing a microstrip filter having the composition as described above will be explained referring to FIGS. 2 and 3.

For the fabrication of a band-pass microstrip filter, a substrate having conductor layers 2A and 3A attached to both surfaces thereof as shown in FIG. 3(A) is prepared as the dielectric substrate 1. The conductor layer 2A on the dielectric substrate 1 is etched so that a part in which the filter pattern is to be produced remains as shown in FIG. 3(B) by photolithography (step S1 in FIG. 2).

Secondly, capacitance between the processed conductor layer 2A and the ground surface (conductor layer 3A) is measured (step S2). By measuring the substrate capacitance between the conductor layer 2A and the ground surface only within the part left for producing the filter pattern, the uncertainty in the relationship between the capacitance and the center frequency, which arises when there are major errors or variations in the area of the substrate, in the edge thickness of the substrate, etc., can be eliminated. Moreover, the effects of variations in the dielectric constant etc. in the substrate can be reduced.

Then, deviation in the center frequency of microstrip resonators is estimated based on the measured capacitance, experientially or by means of electromagnetic field simulations, etc. (step S3 in FIG. 2). Variations in the capacitance of the dielectric substrate 1 are caused mainly by variations in the thickness of the substrate, and more minutely, by variations in the in-plane thickness of the substrate and the dielectric constant of the substrate material. The capacitance of the dielectric substrate 1 is directly measured in order to evaluate the deviation of the center frequency caused by such factors comprehensively.

Subsequently, a resonator length cut-down length, that is, a length by which the resonators are to be shortened in order to adjust the deviated center frequency to a design value, is obtained (step S4 in FIG. 2). For example, the relational expression of the capacitance and center frequency is obtained in advance by experiments or electromagnetic field simulations. The center frequency provided by the length of the resonators before adjustment is reckoned based on the relational expression and the measured capacitance, and then the deviation of the center frequency from the design value is estimated. Since the center frequency of the resonators is in inverse proportion to their length, it is possible to obtain the resonator length and the resonator length cut-down length by which the deviation of the center frequency can be canceled. On this occasion, the resonator length in the original filter pattern before adjustment is designed or set so that the center frequency is necessarily equal to or lower than the design value based on the range of variations estimable in advance such as errors in substrate thickness and the like. Such setting obviates the need for lengthening the resonator length, and the resonators may need adjustment only for shortening their length. Therefore, the adjustment can be carried out by means of etching only, and thereby the manufacturing yield can be increased. Incidentally, while the resonator length cut-down length is obtained in this embodiment by directly measuring the capacitance of the dielectric substrate 1, it is also possible to evaluate the substrate capacitance by measuring the thickness of the substrate. That is, when the substrate thickness is obtained, the capacitance of material having the even and uniform dielectric constant can be calculated, and therefore the resonator length cut-down length can be obtained using the calculated capacitance. On this occasion, if the deviation of the center frequency estimated from the capacitance is significantly different from that obtained by deviation in substrate thickness, there is a possibility of extremely large variation in dielectric constant distribution in the dielectric substrate 1, or extremely large variation in the in-plane thickness of the substrate, which is usually small. Therefore, the substrate should preferably be regarded as not applicable in such cases.

Figure 2:
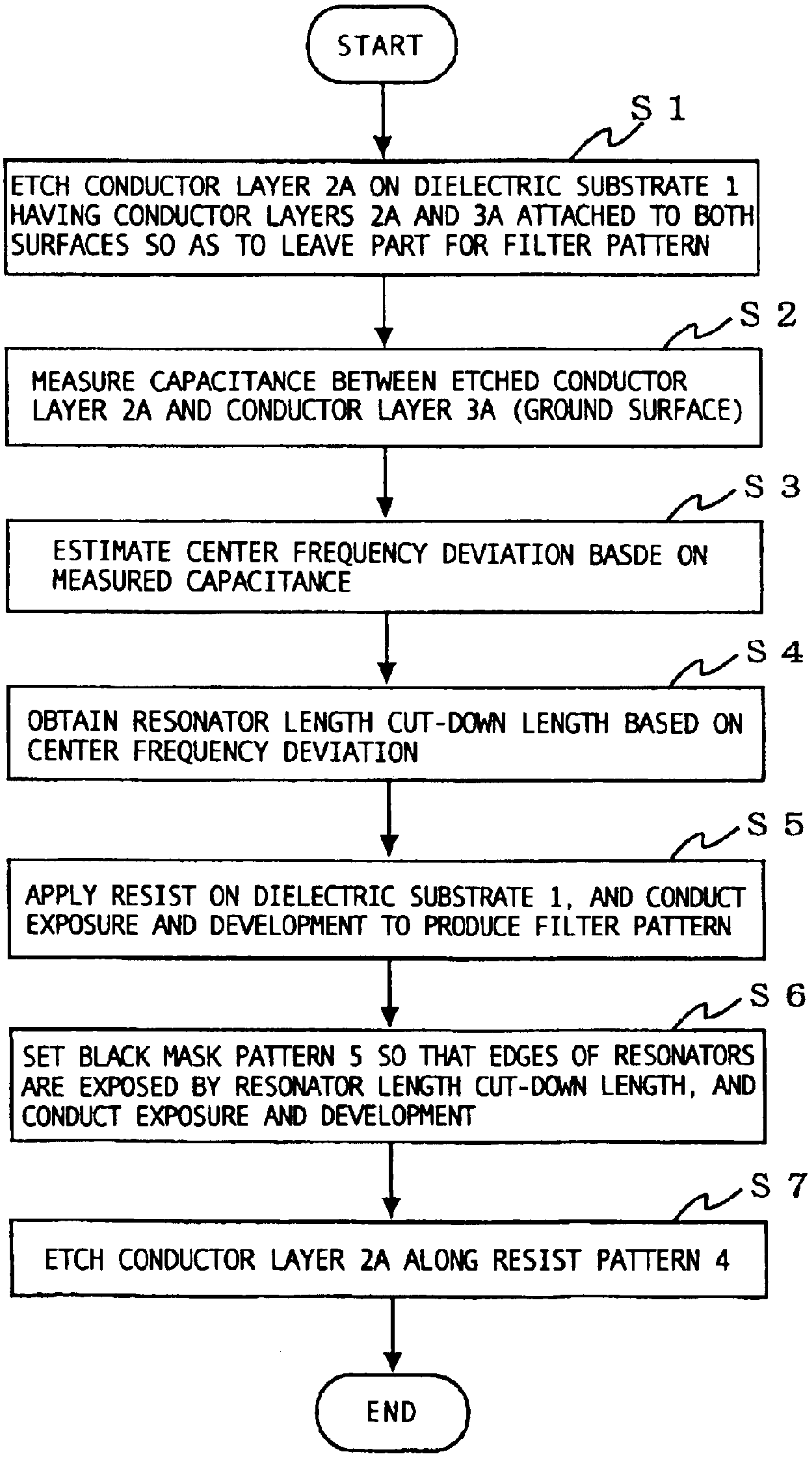
FIG. 2 is a manufacturing process flowchart for explaining the microstrip filter manufacturing method according to the present invention.
Figure 3:
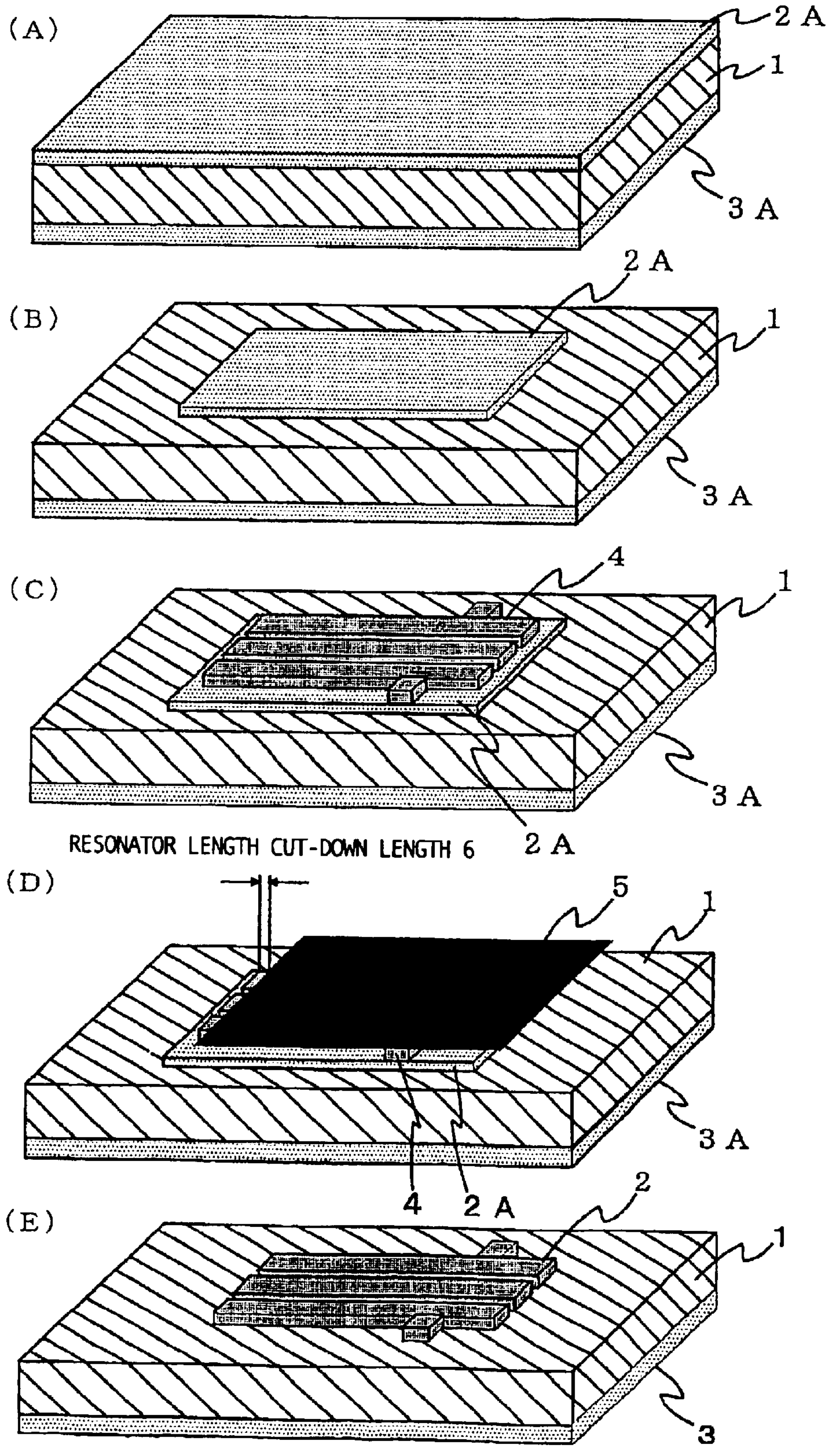
FIG. 3 shows perspective views of a microstrip filter in the respective steps of manufacturing process for explaining the microstrip filter manufacturing method according to the present invention.

In the next place, a resist is coated on the substrate shown in FIG. 3(B), and the resist is formed into a resist pattern 4, a filter pattern before resonator length adjustment, as shown in FIG. 3(C) by photolithography (exposure/development) (step S5 in FIG. 2).

After that, a black mask pattern 5 as shown in FIG. 3(D) is set so that the edge of the resist pattern 4 is exposed by the resonator length cut-down length 6 calculated at step S4, and exposure and development are carried out (step S6 in FIG. 2). When a contact aligner is used for exposure, the edges of the black mask pattern 5 and the resist pattern 4 are once aligned, and then the black mask pattern 5 is shifted or offset by a desired distance (resonator length cut-down length 6). The amount of offset is adjusted, for example, by markings which have been plotted at intervals of 0.5 $\mu$m on the mask. When a stepper is used for exposure, the edges of the black mask pattern 5 and the resist pattern 4 are once aligned, and after that, the stage is moved so that the edge of the resist pattern 4 is exposed from the black mask pattern 5 by the resonator length cut-down length 6 calculated at step S4 using a function for stage movement on the order of submicron or still finer, which is generally installed in the stepper. Besides, in the case where a plurality of filters realizing the same characteristics are manufactured successively, one and the same mask is used for forming the resist coated on the conductor layer 2A into the resist pattern 4 for all the filters. Similarly, as the black mask pattern 5, one and the same mask is used. Accordingly, the patterning of the filters can be conducted with the use of only two masks.

Thereafter, the conductor layer 2A is etched along the resist pattern 4 in which the resonator length has been adjusted, and the resist pattern 4 is removed to thereby produce a filter pattern 2 with the adjusted resonator length as shown in FIG. 3(E). Common dry etch techniques can be used for the etching.

In the aforementioned manufacturing process, the black mask pattern 5 is set so as to be offset with respect to the filter pattern 4 by the resonator length cut-down length, and exposure and development are carried out to produce the resist pattern 4 with adjusted the resonator length. However, the resonator length may also be adjusted by first defining a filter pattern before resonator length adjustment in the conductor layer 2A on the dielectric substrate 1 with the resist pattern 4 acting as a mask, and then exposing the defined filter pattern of the conductor layer 2A through the black mask pattern 5, which is offset with respect to the filter pattern by the resonator length cut-down length.

Figure 4:
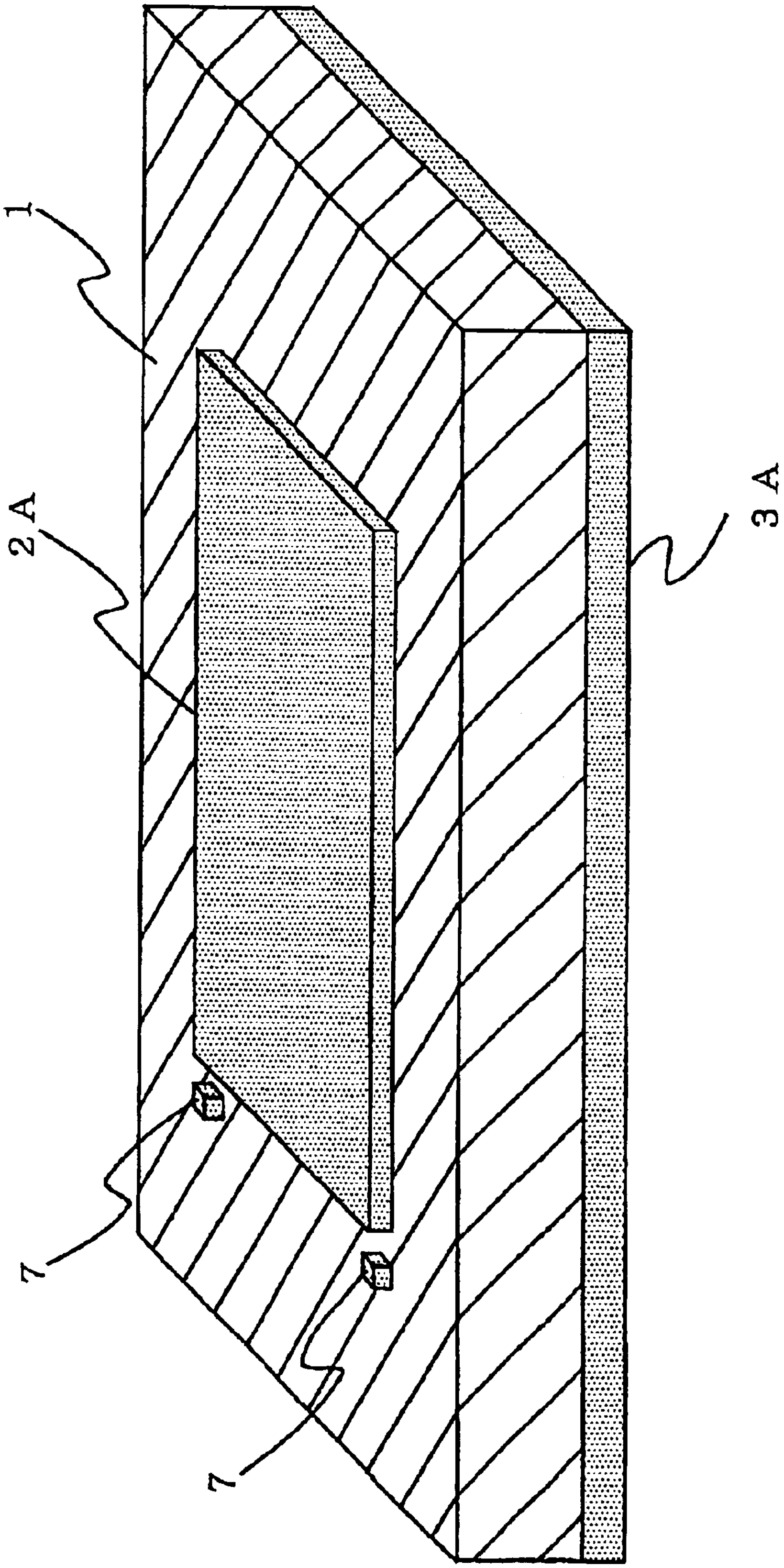
FIG. 4 is a perspective view showing an example of register marks which are used in the microstrip filter manufacturing method according to the present invention.
Figure 5:
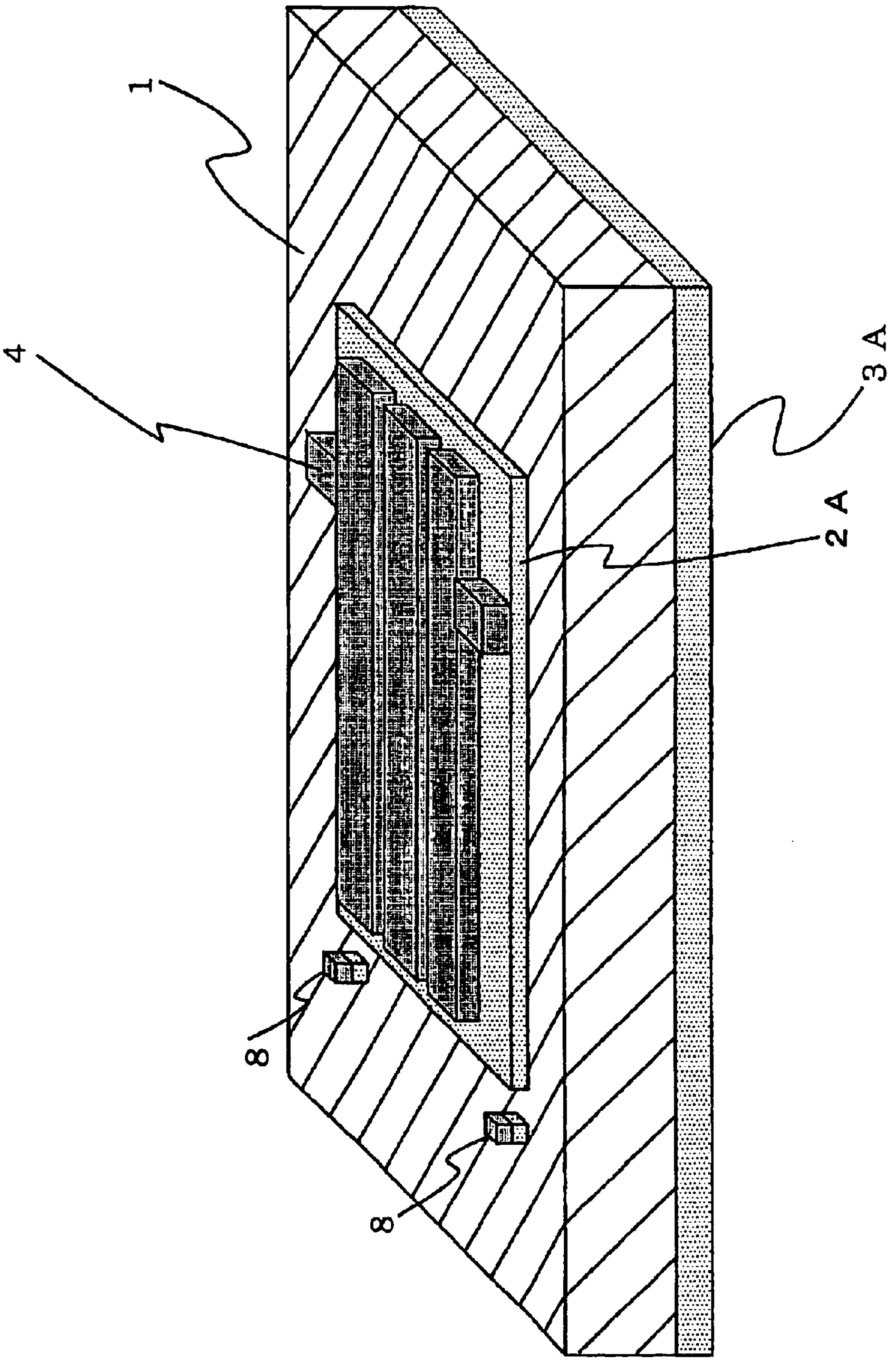
FIG. 5 is a perspective view showing another example of register marks which are used in the microstrip filter manufacturing method according to the present invention.
Figure 6:
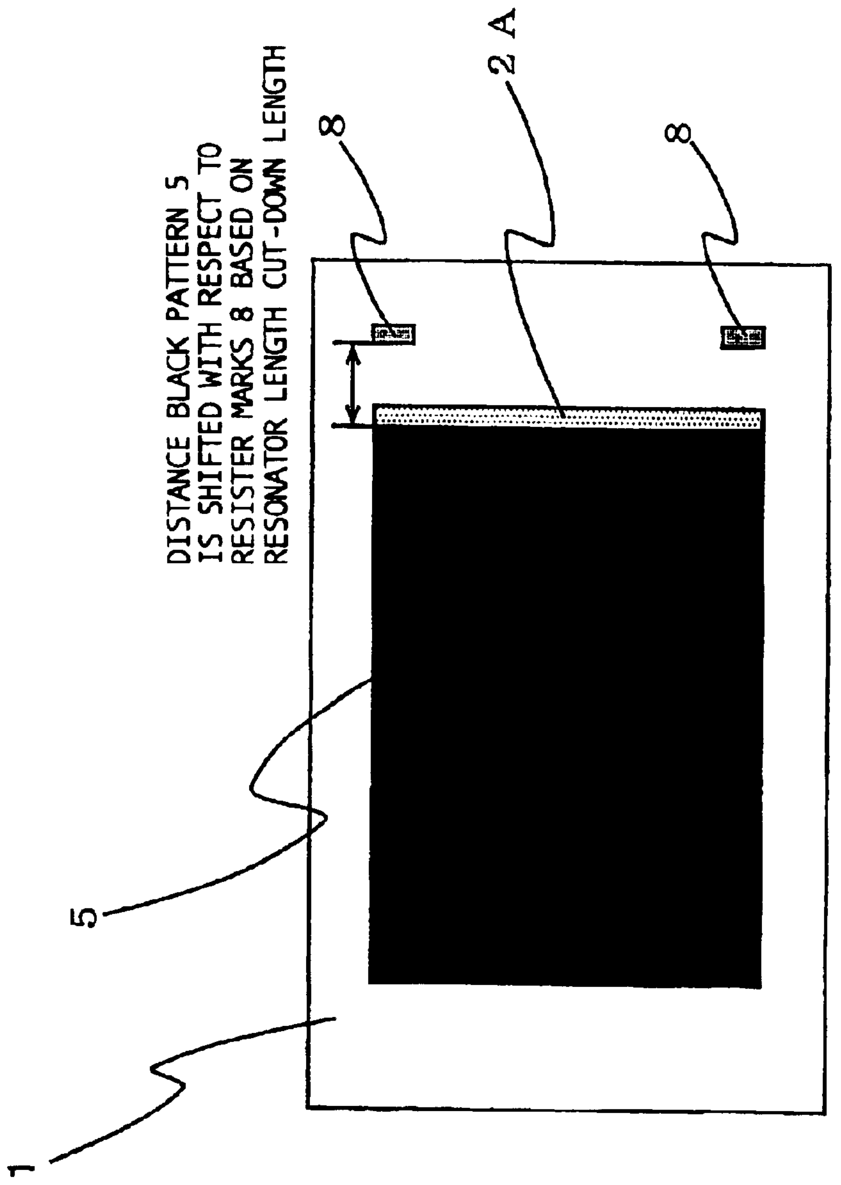
FIG. 6 is a diagram for explaining the positioning of a mask pattern with reference to the register marks in the microstrip filter manufacturing method according to the present invention.

On the occasion of producing the pattern shown in FIG. 3(B) at step S1 and the pattern shown in FIG. 3(C) at step S5, register marks 7 and 8 shown in FIGS. 4 and 5 may be formed, respectively. The register marks can be formed either at step S1 or at step S5. In addition, it is also possible to newly form, at step S5, the register marks 8 on the register marks 7 which have been formed at step S1. FIG. 5 is a diagram showing an example of the register marks. In FIG. 5, the register marks 8 are formed on the register marks 7. The positioning of the black mask pattern 5 is performed making use of these register marks. In the case of manufacturing the microstrip filter with the use of such register marks, the register marks 7 or 8 are formed at step S1 or step S5 in the manufacturing process, and after the edge of the black mask pattern 5 is once aligned with the register marks 7 or 8 at step S6, the black mask pattern 5 is shifted so as to be properly positioned on the substrate based on the resonator length cut-down length calculated at step S4 as shown in FIG. 6. The exposure and development of step S6 are carried out with the black mask pattern 5, which has been positioned making use of the register marks 7 or 8, and thereby the resonator length is adjusted. Incidentally, such positioning of the black mask pattern 5 referring to the register marks can be performed with respect to the resist pattern 4 for defining the filter pattern 2 in the conductor layer 2A, and also with respect to the conductor layer 2A that has been patterned into the filter pattern before resonator length adjustment.

At step S5 for applying the resist on the dielectric substrate 1 and exposing and developing it to produce the filter pattern, the resist may be exposed, developed and etched through a mask in the filter pattern before the resonator length adjustment. The resist may also be exposed through a mask in the filter pattern before the resonator length adjustment and, after that, exposed, developed and etched using the black mask pattern 5 set or positioned on the resist with reference to the register marks.

In addition, since the black mask pattern 5 can be set by the use of the register marks 7 or 8, the filter resist pattern 4 may be produced by positioning the black mask pattern 5 on the conductor layer 2A shown in FIG. 4 with reference to the register marks 7 and then conducting exposure and development to thereby adjust the resonator length. Further, it is also possible to carry out exposure, development and also etching when the black mask pattern 5 is positioned on the conductor layer 2A using the register marks 7, and thereafter form the filter resist pattern 4.

In the case where the register marks 7 are formed at step S1, in the process for producing the filter resist pattern 4, it is also possible to merely transfer the filter pattern before the resonator length adjustment to the resist by carrying out exposure, then, without executing development, set the black mask pattern 5 on the resist by use of the register marks 7, carry out exposure, and thereafter perform development of the resist, to which the filter patterns have been transferred, at once. In this case, however, the frequency characteristics of the microstrip filter might be deteriorated if unnecessary part of the conductor layer 2A remains in the vicinity of the filter resist pattern 4. Therefore, it is desirable that the unnecessary part of the conductor layer 2A be removed as perfectly as possible.

As is described above, in accordance with an embodiment of the present invention, a step for adjusting the resonator length of the microstrip resonators is included in the process for creating the filter pattern. Since the resonator length can be adjusted during the filter manufacturing process, there is no need for the complicated steps in the prior art of packaging the filter to measure the frequency characteristics of the filter in the inspection process after the manufacturing process, returning the filter to the manufacturing process, and adjusting the resonator length. Thus, microstrip filters can be manufactured at low cost.

In addition, after the filter resist pattern 4 is formed, the resist pattern 4 is exposed to light through a pattern for shortening the resonator length, and thereby the resonator length of the microstrip resonators is adjusted. Consequently, the need of extra resist coating process etc. can be saved. If the positioning of the black mask pattern 5 is carried out with reference to the filter resist pattern 4, extra register marks etc. can be eliminated.

Moreover, after the filter pattern is formed, the filter pattern is exposed through a pattern for shortening the resonator length, and, therefore, the adjusted filter pattern can be obtained by carrying out exposure only twice in a filter manufacturing process. In other words, the number of the steps included in the manufacturing process can be reduced.

Furthermore, by forming the register marks 7 and/or 8, the black mask pattern 5 can be set properly making use of the register marks, which enables the exposure in order to produce a pattern for shortening the resonator length.

Incidentally, variations in the capacitance of the dielectric substrate are caused mainly by variations in substrate thickness, and more minutely, by variations in the in-plane thickness of the substrate and the dielectric constant of substrate material. The center frequency deviation caused by the effects of such factors can be evaluated comprehensively by directly measuring the capacitance of the dielectric substrate. Especially, in the case of manufacturing the microstrip filter, the dielectric substrate 1 has conductor layers on its both surfaces before the filter pattern is produced. Therefore, by the measurement of the capacitance between the conductors, deviation in the center frequency can be predicted. Thus, the resonator length cut-down length can also be estimated.

The resonator length cut-down length for the microstrip resonators may also be calculated based on the thickness of the dielectric substrate, which has been measured in advance. By the measurement of substrate thickness made in advance, deviation in the center frequency caused by substrate thickness variations can be estimated, and inversely, the resonator length cut-down length can also be estimated. Accordingly, the resonator length cut-down length can be determined prior to producing the filter pattern without measuring the frequency characteristics to make a judgment after the filter is once formed.

Further, by designing the filter pattern so that the center frequency of the microstrip resonators becomes a desired center frequency or less based on the range of estimated error between the desired thickness and actual thickness of the dielectric substrate, the need for increasing the resonator length is eliminated, and the adjustment can be made by shortening the resonator length only. Consequently, the adjustment can be carried out by means of etching only, and thereby the manufacturing yield can be increased.

In the measurement of the substrate capacitance, the capacitance of the substrate is measured between the conductor layer, only within the part where the filter pattern is to be produced, and the ground surface in advance. The resonator length cut-down length is determined based on the result of the measurement. Therefore, the uncertainty in the relationship between the capacitance and the center frequency, which arises especially when there are major errors or variations in substrate area (size), in substrate edge thickness and the like, can be eliminated. Additionally, the effects of dielectric constant variations etc. in the substrate can be reduced.

In the case where a plurality of filters realizing the same characteristics are manufactured successively, one and the same mask is used as a mask pattern for all the filters. Besides, one and the same mask pattern is employed for shortening the resonator length with the use of the registration mechanism of a contact aligner or a stepper. That is, one and the same filter pattern can be used with respect to each substrate. Further, by setting the mask pattern for shortening the resonator length so that it is offset by a desired length using the registration mechanism of a contact aligner or a stepper, the resonator length can be shortened by a length corresponding to the thickness of respective dielectric substrates with one and the same mask pattern. Consequently, the patterning of the filters can be conducted with only two masks, and thereby the filters can be manufactured at low cost.

Still further, by employing a superconductor as conductor material for the band-pass microstrip filter, a multistage narrow-band-pass filter of ten or more stages can be build up. If a high-temperature superconductor is employed as conductor material for the microstrip filter, the use of a small-sized (lightweight) and low-priced cooler becomes possible.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

INDUSTRIAL APPLICABILITY

As set forth hereinabove, in accordance with the present invention, a step for adjusting the resonator length of microstrip filter resonators is included in the process for creating filter patterns. Thereby, the resonator length can be adjusted during the filter manufacturing process, and there is no need for the complicated steps in the prior art of packaging a filter to measure the frequency characteristics of the filter in the inspection process after the manufacturing process, returning the filter to the manufacturing process, and adjusting the resonator length. Thus, microstrip filters can be manufactured at low cost.

In addition, a resist formed in a filter pattern before resonator length adjustment is exposed through a mask pattern for shortening the resonator length in order to form a conductor pattern of a filter pattern formation area into a filter pattern with an adjusted resonator length. Consequently, the need of extra resist coating process etc. can be saved. If the positioning of the mask pattern is carried out with reference to the filter resist pattern, extra register marks etc. can be eliminated.

Moreover, after the filter pattern is formed, the filter pattern is exposed through the pattern for shortening the resonator length, and, therefore, the adjusted filter pattern can be obtained by carrying out exposure only twice in a filter manufacturing process. In other words, the number of the steps included in the manufacturing process can be reduced.

Furthermore, by forming register marks, the mask pattern for shortening the resonator length can be set properly making use of the register marks, which enables the exposure in order to produce the pattern with an adjusted resonator length.

Incidentally, variations in the capacitance of a dielectric substrate are caused mainly by variations in substrate thickness, and more minutely, by variations in the in-plane thickness of the substrate and the dielectric constant of substrate material. The center frequency deviation caused by the effects of such factors can be evaluated comprehensively by directly measuring the capacitance of the dielectric substrate. Especially, in the case of manufacturing the microstrip filter, the dielectric substrate has conductor layers on its both surfaces before the filter pattern is produced. Therefore, by the measurement of the capacitance between the conductors, deviation in the center frequency can be predicted. Thus, a resonator length cut-down length can also be estimated.

The resonator length cut-down length for the microstrip resonators may also be calculated based on the thickness of the dielectric substrate, which has been measured in advance. By the measurement of substrate thickness made in advance, deviation in the center frequency caused by substrate thickness variations can be estimated, and inversely, the resonator length cut-down length can also be estimated. Accordingly, the resonator length cut-down length can be determined prior to producing the filter pattern without measuring the frequency characteristics to make a judgment after the filter is once formed.

Further, by designing the filter pattern so that the center frequency of the microstrip resonators becomes a desired center frequency or less based on the range of estimated error between the desired thickness and actual thickness of the dielectric substrate, the need for increasing the resonator length is eliminated, and the adjustment can be made by shortening the resonator length only. Consequently, the adjustment can be carried out by means of etching only, and thereby the manufacturing yield can be increased.

In the measurement of the substrate capacitance, the capacitance of the substrate is measured between the conductor layer, only within the area where the filter pattern is to be produced, and the ground surface in advance. The resonator length cut-down length is determined based on the result of the measurement. Therefore, the uncertainty in the relationship between the capacitance and the center frequency, which arises especially when there are major errors or variations in substrate area (size), in substrate edge thickness and the like, can be eliminated. Additionally, the effects of dielectric constant variations etc. in the substrate can be reduced.

In the case where a plurality of filters realizing the same characteristics are manufactured successively, one and the same mask is used as a mask pattern for all the filters. Besides, one and the same mask pattern is employed for shortening the resonator length with the use of the registration mechanism of a contact aligner or a stepper. That is, one and the same filter pattern can be used with respect to each substrate. Further, by setting the mask pattern for shortening the resonator length so that it is offset by a desired length using the registration mechanism of a contact aligner or a stepper, the resonator length can be shortened by a length corresponding to the thickness of respective dielectric substrates with one and the same mask pattern. Consequently, the patterning of the filters can be conducted with only two masks, and thereby the filters can be manufactured at low cost.

Still further, by employing a superconductor as conductor material for the band-pass microstrip filter, a multistage narrow-band-pass filter of ten or more stages can be build up. If a high-temperature superconductor is employed as conductor material for the microstrip filter, the use of a small-sized (lightweight) and low-priced cooler becomes possible.

What is claimed is:

1. A method for manufacturing a microstrip filter made up by placing a plurality of microstrip resonators each resonating at the center frequency of a pass band at intervals corresponding to a coupling coefficient, characterized in that a resonator length adjustment step for adjusting the resonator length of microstrip resonators without measuring and inspecting the frequency characteristics of the microstrip filter is included in a filter pattern processing step for processing a conductor layer formed on a dielectric substrate into a filter pattern of the microstrip filter.

2. The method for manufacturing a microstrip filter claimed in claim 1, wherein the filter pattern processing step includes: the step of defining a conductor pattern of a filter pattern formation area in the conductor on the dielectric substrate; the step of defining a filter pattern before resonator length adjustment in the conductor; and the resonator length adjustment step for forming the filter pattern before resonator length adjustment into a filter pattern with an adjusted resonator length using a mask pattern for shortening the resonator length.

3. The method for manufacturing a microstrip filter claimed in claim 1, wherein the filter pattern processing step includes: the step of defining a conductor pattern of a filter pattern formation area in the conductor on the dielectric substrate; the step of forming a resist coated on the conductor into a first resist pattern in a filter pattern before resonator length adjustment; the resonator length adjustment step for forming the first resist pattern into a second resist pattern in a filter pattern with an adjusted resonator length using a mask pattern for shortening the resonator length; and the step of etching the conductor pattern using the second resist pattern as a mask.

4. The method for manufacturing a microstrip filter claimed in claim 1, wherein the filter pattern processing step includes: the step of forming one or more first register marks made of the conductor at predetermined positions on the dielectric substrate as well as etching the conductor on the dielectric substrate to produce a conductor pattern of a filter pattern formation area; the step of applying a resist on the dielectric substrate; the step of forming one or more second register marks made of the resist at predetermined positions on the dielectric substrate as well as exposing and developing the resist so as to produce a filter pattern before resonator length adjustment as a first resist pattern; the step of forming the conductor pattern into the filter pattern before resonator length adjustment using the first resist pattern as a mask; and the resonator length adjustment step for forming the filter pattern before resonator length adjustment into a filter pattern with an adjusted resonator length using a mask pattern for shortening the resonator length and one at least of the first and second register marks.

5. The method for manufacturing a microstrip filter claimed in claim 1, wherein the filter pattern processing step includes: the step of forming one or more first register marks made of the conductor at predetermined positions on the dielectric substrate as well as etching the conductor on the dielectric substrate to produce a conductor pattern of a filter pattern formation area; the step of applying a resist on the dielectric substrate; the step of forming one or more second register marks made of the resist at predetermined positions on the dielectric substrate as well as exposing and developing the resist so as to produce a filter pattern before resonator length adjustment as a first resist pattern; the resonator length adjustment step for forming the first resist pattern into a second resist pattern in a filter pattern with an adjusted resonator length using a mask pattern for shortening the resonator length and one at least of the first and second register marks; and the step of etching the conductor pattern using the second resist pattern as a mask.

6. The method for manufacturing a microstrip filter claimed in claim 1, wherein the filter pattern processing step includes: the step of forming one or more register marks made of the conductor at predetermined positions on the dielectric substrate as well as etching the conductor on the dielectric substrate to produce a conductor pattern of a filter pattern formation area; the step of applying a resist on the dielectric substrate; the step of exposing the resist in the filter pattern formation area using a mask pattern in a filter pattern before resonator length adjustment; the resonator length adjustment step for exposing and developing the resist in the filter pattern formation area using a mask pattern for shortening the resonator length and the register marks; and the step of etching the conductor pattern using the developed resist as a mask so as to produce a filter pattern with an adjusted resonator length on the dielectric substrate.

7. The method for manufacturing a microstrip filter claimed in claim 1, wherein the filter pattern processing step includes: the step of producing a first resist pattern of a first resist on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the step of exposing and developing the first resist pattern on the conductor pattern so as to produce a second resist pattern using a mask pattern for shortening the resonator length and the register marks; the resonator length adjustment step for etching the conductor pattern using the second resist pattern as a mask; the step of applying a second resist on the conductor pattern with an adjusted resonator length after removing the first resist, and exposing and developing the second resist so as to produce a third resist pattern using a mask in a filter pattern before resonator length adjustment; and the step of etching the conductor pattern using the third resist pattern as a mask so as to produce a filter pattern with an adjusted resonator length on the dielectric substrate.

8. The method for manufacturing a microstrip filter claimed in claim 1, wherein the filter pattern processing step includes: the step of producing a first resist pattern on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the resonator length adjustment step for exposing and developing the first resist pattern on the conductor pattern so as to produce a second resist pattern using a mask pattern for shortening the resonator length and the register marks; the step of exposing and developing the second resist pattern so as to produce a third resist pattern using a mask in a filter pattern before resonator length adjustment; and the step of etching the conductor pattern using the third resist pattern as a mask so as to produce a filter pattern with an adjusted resonator length on the dielectric substrate.

9. The method for manufacturing a microstrip filter claimed in claim 1, wherein the filter pattern processing step includes: the step of producing a first resist pattern on the dielectric substrate; the step of forming one or more register marks made of the conductor at predetermined positions on the dielectric substrate as well as etching the conductor on the dielectric substrate to produce a conductor pattern of a filter pattern formation area using the first resist pattern as a mask; the resonator length adjustment step for exposing the first resist pattern on the conductor pattern using a mask pattern for shortening the resonator length and the register marks; the step of exposing and developing the first resist pattern so as to produce a second resist pattern using a mask in a filter pattern before resonator length adjustment; and the step of etching the conductor pattern using the second resist pattern as a mask so as to produce a filter pattern with an adjusted resonator length on the dielectric substrate.

10. The method for manufacturing a microstrip filter claimed in claim 2, wherein, at the resonator length adjustment step, the mask pattern is set so as to be offset with respect to the conductor pattern by a length by which the length of the microstrip resonators is to be shortened, which is calculated based on the capacitance of the in advance.

11. The method for manufacturing a microstrip filter claimed in claim 2, wherein, at the resonator length adjustment step, the mask pattern is set so as to be offset with respect to the conductor pattern by a length by which the length of the microstrip resonators is to be shortened, which is calculated based on the thickness of the dielectric substrate measured in advance.

12. The method for manufacturing a microstrip filter claimed in claim 10, wherein the capacitance of the dielectric substrate is measured between a ground conductor which has been formed on one surface of the substrate and the conductor pattern which has been produced in the filter pattern formation area on the other surface of the substrate.

13. The method for manufacturing a microstrip filter claimed in claim 2, wherein the filter pattern before resonator length adjustment is designed so that the center frequency of the microstrip resonators becomes a desired center frequency or less based on the range of estimated error between the desired thickness and actual thickness of the dielectric substrate.

14. The method for manufacturing a microstrip filter claimed in claim 1, wherein a superconductor is used as the conductor material of the microstrip resonators.

15. The method for manufacturing a microstrip filter claimed in claim 1, wherein a high-temperature superconductor is used as the conductor material of the microstrip resonators.

* * * * *